(12) United States Patent
Hoshi et al.

(10) Patent No.: US 6,271,708 B1
(45) Date of Patent: Aug. 7, 2001

(54) GATE CIRCUIT

(75) Inventors: Kimihiro Hoshi, Tokyo; Takeo Kanai, Saitama-ken, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/368,162

(22) Filed: Aug. 5, 1999

(30) Foreign Application Priority Data

Aug. 5, 1998 (JP) .................................................. 10-220954

(51) Int. Cl.$^7$ ................................................. H03K 17/04
(52) U.S. Cl. ........................ 327/377; 327/440; 327/432; 327/478
(58) Field of Search ............................ 327/108–112, 376, 327/377, 374, 433, 403–405, 478, 482, 434, 170, 432, 440

(56) References Cited

U.S. PATENT DOCUMENTS

| | | | |
|---|---|---|---|
| 5,055,721 | * | 10/1991 | Majumdar et al. .................. 327/434 |
| 5,089,719 | * | 2/1992 | Kamei et al. . |
| 5,432,471 | * | 7/1995 | Majumdar et al. .................. 327/432 |
| 5,617,048 | * | 4/1997 | Ward et al. ......................... 327/205 |
| 5,625,312 | | 4/1997 | Kawakami et al. ................. 327/483 |
| 5,796,294 | * | 8/1998 | Perry ................................... 327/538 |
| 5,949,273 | * | 9/1999 | Mourick et al. .................... 327/434 |
| 5,977,814 | * | 11/1999 | Ishii .................................... 327/434 |
| 5,986,484 | * | 11/1999 | Kimata ............................... 327/108 |

\* cited by examiner

*Primary Examiner*—Terry D. Cunningham
*Assistant Examiner*—Long Nguyen
(74) *Attorney, Agent, or Firm*—Foley & Lardner

(57) ABSTRACT

In a gate circuit having a turn-off gate circuit composed of: OFF gate power source $E_{off}$ of which one terminal is connected to the emitter of semiconductor switching element 81, and switch $SW_{off}$ that connects the other terminal of OFF gate power source $E_{off}$ and the gate of semiconductor switching element S1 via resistor $R_g$, the gate circuit is provided with second switch $SW_{off}2$ that connects the other terminal of OFF gate power source $E_{off}$ and the gate of semiconductor switching element S1. By closing second switch $SW_{off}2$ at the timing at which the turn-off operation is completed, it will connect to OFF gate power source $E_{off}$ without passing through a resistor.

8 Claims, 8 Drawing Sheets

GATE CIRCUIT

BACKGROUND OF INVENTION

1. Field of Invention

The present invention relates to the gate circuits of MOS gate type semiconductor elements.

2. Description of the Related Art

MOS gate type semiconductor elements have many advantages, such as small gate circuits and low energy consumption compared with thyristor semiconductor elements.

FIG. 1 is a block diagram of a single-phase inverter that uses MOS gate type semiconductor elements.

In FIG. 1, S1~S4 are MOS gate type semiconductor elements, 3 is a capacitor and 4 is the load. Here, a plurality of IEGT are used as the MOS gate type semiconductor elements.

Gate circuits G1~G4 are connected to MOS gate type semiconductor elements S1~S4. The detail of this is shown in FIG.2.

The gate circuit has ON gate power source $E_{on}$, OFF gate power source $E_{off}$, turn-on switch $SW_{on}$, and turn-off switch $SW_{off}$. The node between turn-on switch $SW_{on}$ and turn-off switch $SW_{off}$ is connected to gate G of the MOS gate type semi-conductor element via gate resistor $R_g$. The node between ON gate power source $E_{on}$ and OFF gate power source $E_{off}$ is connected to emitter E of the MOS gate type semiconductor element.

Normally, about 15V is used for ON gate power source $E_{on}$ and OFF gate power source $E_{off}$, and about 10□ for gate resister $R_g$.

The relationship between MOS gate type semiconductor elements S1 and S2 or between MOS gate type semiconductor elements S3 and S4 is referred to as that of upper and lower arms in a single-phase inverter. Normally, upper and lower arms, for example MOS gate type semiconductor elements S1 and S2, do not switch simultaneously. One or other puts the gate circuit in a negative bias state so that there is no fire (turn-on), and the other is switched ON/OFF.

However, there are the following problems with prior art gate circuits.

Provided the gate potential of the element, for example element S1, that is negatively biased is sufficiently negatively biased, there is no problem. However, when the other element, S2, turns ON, if the gate potential of element S1, that is to say the negative bias potential, is transiently overcome by the positive side as shown in FIG. 3, element S1 will also turn ON. Thus, the arm is shorted out by elements S1 and S2 turning ON simultaneously.

This phenomenon of the transient overcoming of the negative bias is becoming a problem as MOS gate type semiconductor elements are being made to withstand higher voltages.

Another problem occurs when attempting to turn OFF multiple parallel-connected elements with one gate circuit. That is to say, the gate potentials of the elements become unstable and current unbalance arises through the generation of circulating currents between the gate circuit emitter wiring and the principal circuit emitter wiring.

This phenomenon is explained using FIG. 4 and FIG. 5. FIG. 4 is a block diagram of a single-phase inverter in which each arm is composed of two parallel-connected elements. FIG. 5 is an expanded detail drawing of part of FIG. 4.

Here, elements S11 and S12 are in the conductive state and a current is flowing; then elements S11 and S12 are turned off to break the current. When this is done, currents $i_{11}$ and $i_{12}$ generate the circulating current of loop A. The potentials of the emitter elements for the gates of elements S11 and S12 oscillate due to variation of this current and the wiring impedance, and current-unbalance occurs.

SUMMARY OF THE INVENTION

Accordingly, one object of the present invention is to provide a novel gate circuit in which the negative bias does not fluctuate when switching, and circulating currents between the gate circuit and the parallel connected gates are eliminated.

To achieve the above object, in a gate circuit having a turn-off gate circuit composed of:

an OFF gate power source of which one terminal that becomes the power source when a semiconductor switching element turns off is connected to the emitter of the semiconductor switching element, and a first switch that connects the other terminal of the above OFF gate power source and the gate of the semiconductor switching element via a resistor, with the gate circuit concerned in the present invention, a second switch is provided that connects the other terminal of the above OFF gate power source and the gate of the semiconductor switching element. By closing the second switch at a specified timing, it becomes connected to the OFF gate power source with passing via a resistor, and the effect of the negative bias is made much more stable. Therefore, erroneous fire (ignition) is eliminated.

And moreover, in a gate circuit having a turn-off gate circuit composed of:

A first OFF gate power source of which one terminal that becomes the power source when a semiconductor switching element turns off is connected to the emitter of the semiconductor switching element, and a first switch that connects the other terminal of the above first OFF gate power source and the gate of the semiconductor switching element via a resistor, with the gate circuit concerned in the present invention:

a second OFF gate power source, of which one terminal that has a greater absolute value than the above first OFF gate power source is connected to the emitter of the semiconductor switching element and a second switch that connects the other terminal of the above second OFF gate power source and the gate of the semiconductor switching element are provided. By closing the second switch at a specified timing, it becomes connected to the second OFF gate power source that has a greater absolute value than the first OFF gate power source, and the effect of the negative bias is made much more stable. Therefore, erroneous fire is eliminated.

With the gate circuit concerned in the present invention, the above second switch is connected to the gate of the above semiconductor switching element via a second resistor that is smaller than the above resistor. By closing the second switch at a specified timing, it becomes connected to the OFF gate power source via the resistor that is smaller than the above resistor, and the effect of the negative bias is made much more stable. Therefore, erroneous fire is eliminated.

And moreover, with the gate circuit concerned in claim 4 of the present invention, the above second switch is closed at a specified time interval after the above switch has been closed. By closing the second switch after the elapsing of the approximate time for completion of the turn-off operation, a greater negative bias can be applied than in prior art. Therefore, erroneous fire is eliminated.

And moreover, with the gate circuit concerned in the present invention, the said second switch is closed if the gate voltage falls to a specified voltage or below. By closing the second switch when the gate voltage falls to approximately the voltage at which the essential part of the turn-off operation is completed, a greater negative bias can be applied than in prior art. Therefore, erroneous fire is eliminated.

And moreover, with the gate circuit concerned in the present invention, the above second switch is closed when the current flowing in the above semiconductor switching element falls to a set current value or below. By closing the second switch when the current flowing in semiconductor switching element falls to approximately the voltage at which the essential part of the turn-off operation is completed, a greater negative bias can be applied than in prior art. Therefore, erroneous fire is eliminated.

And moreover, with the gate circuit concerned in the present invention, the above second switch is closed when the voltage across the above semiconductor switching element becomes a set voltage value or above. By closing the second switch when the voltage across the semiconductor switching element rises to approximately the voltage at which the essential part of the turn-off operation is completed, a greater negative bias can be applied than in prior art. Therefore, erroneous fire is eliminated.

And moreover, with the gate circuit concerned in the present invention, when semiconductor switching elements having gate circuits are connected in series to compose an arm of a power converter, by closing the above second switch in synchronization with the turn-on of the semiconductor switching element in the opposite arm, a greater negative bias can be applied than in prior art. Therefore, erroneous fire is eliminated.

And moreover, with the gate circuit concerned in the present invention, in a gate circuit that connects in parallel the principal circuit emitter terminals of multiple semiconductor switching elements, and also that is connected to the negative bias source of one gate circuit by the emitter terminals for the gates of those multiple semi-conductor switching elements being connected in parallel, the emitter terminals for the multiple gates and the negative bias of the gate circuit are connected via respective resistors. Since, by this means, no circulating currents are generated on the emitter side, the emitter potentials of the gates do not fluctuate and thus current balance can be achieved.

And moreover, with the gate circuit concerned in the present invention, third switches that short out the above resistors are provided in the above-described gate circuit. The above resistors are shorted out by closing the third switches at a specified timing. Thus, the negative bias can be reliably applied.

And moreover, with the gate circuit concerned in the present invention, the above third switches are closed after completion of turn-off of the above semiconductor switching elements. By this means the above resistors are shorted out, and the negative bias can be reliably applied.

And moreover, with the gate circuit concerned in the present invention, when semiconductor switching elements having above-described gate circuits are connected in series and compose an arm of a power converter, the above third switches are closed in synchronization with the turn-on of the semiconductor switching elements in the opposite arm. By this means the above resistors are shorted out, and the negative bias can be reliably applied.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein:

FIG. 3 is a waveform diagram for when the prior art gate circuit turns on;

DETAILED DESCRIPTION OF THE EMBODIMENTS

Figure 1:
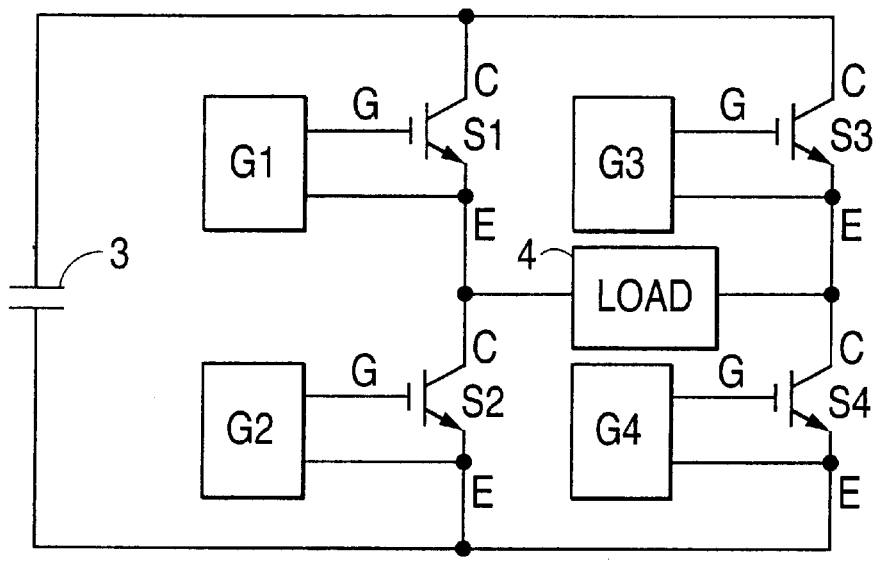
FIG. 1 is a block diagram of a single-phase inverter.

Referring now to the drawings, wherein like reference numerals designate identical or corresponding parts throughout the several views, and more particularly to FIG. 6 thereof, one embodiment of the present invention will be described.

Figure 6:
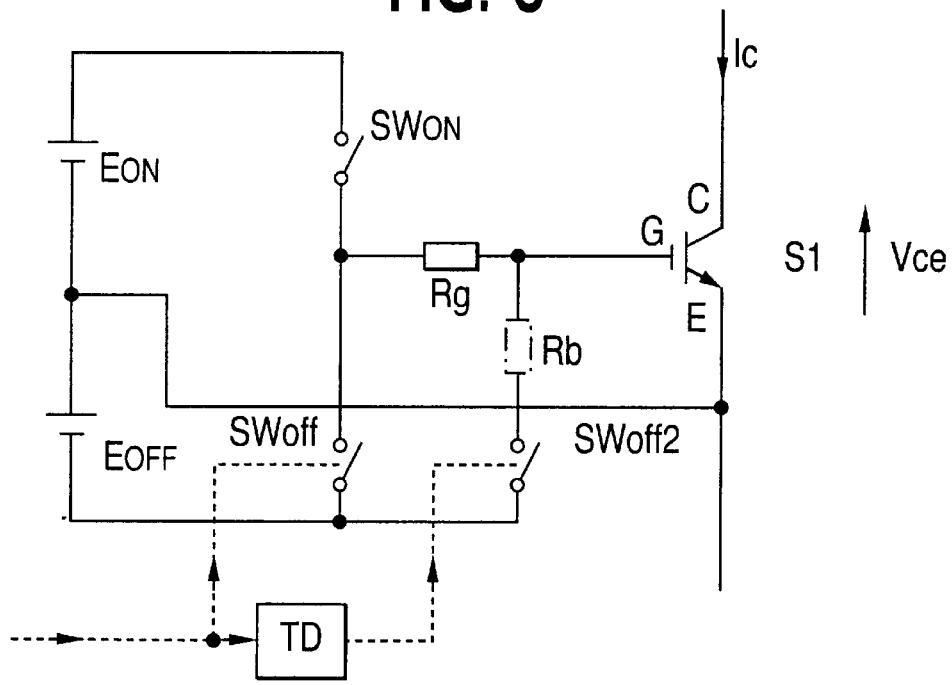
FIG. 6 is a block diagram of a first embodiment of the present invention.
Figure 7:
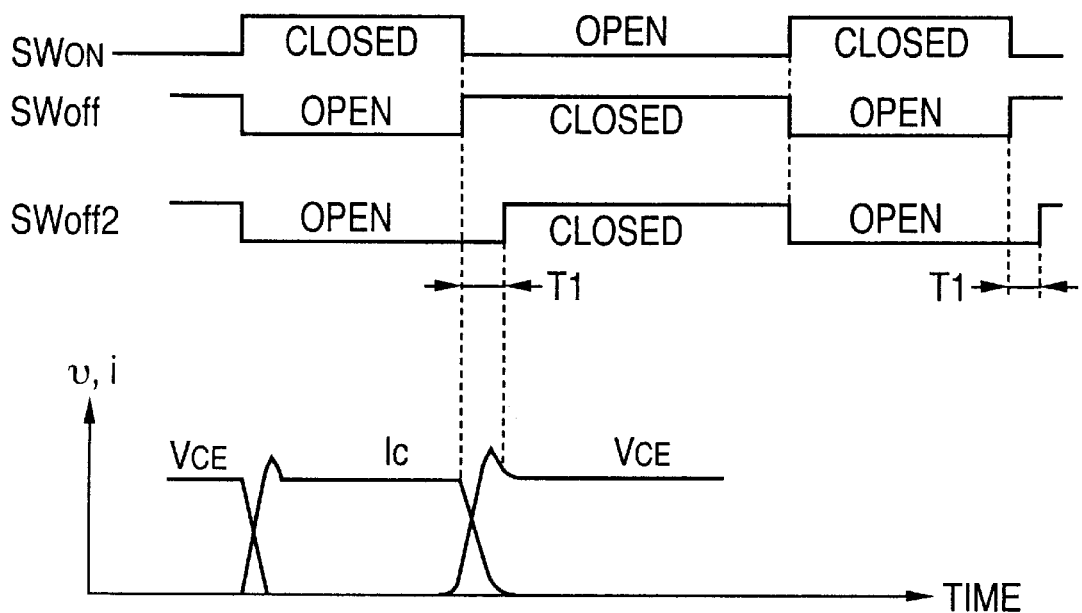
FIG. 7 is a time chart for the first embodiment of the present invention.

FIG. 6 is a block diagram of a first embodiment of the present invention. FIG. 7 is a time chart for the first embodiment. Here, components that are the same as in FIG. 2 have been assigned the same reference symbols, and their descriptions have been omitted.

Figure 2:
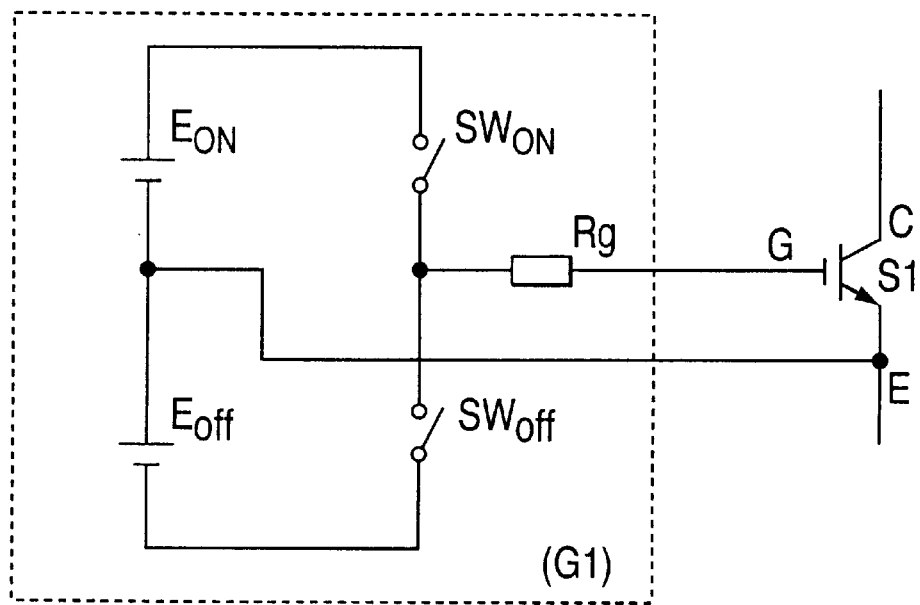
FIG. 2 is a block diagram of a prior art gate circuit.
Figure 3A:
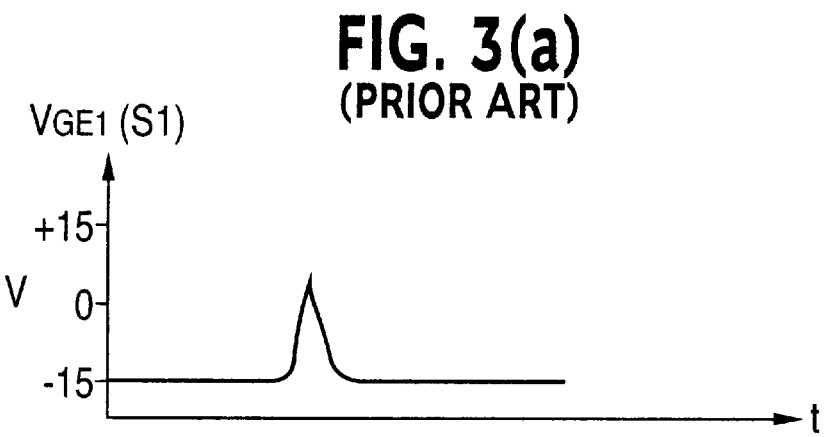
Figure 3B:
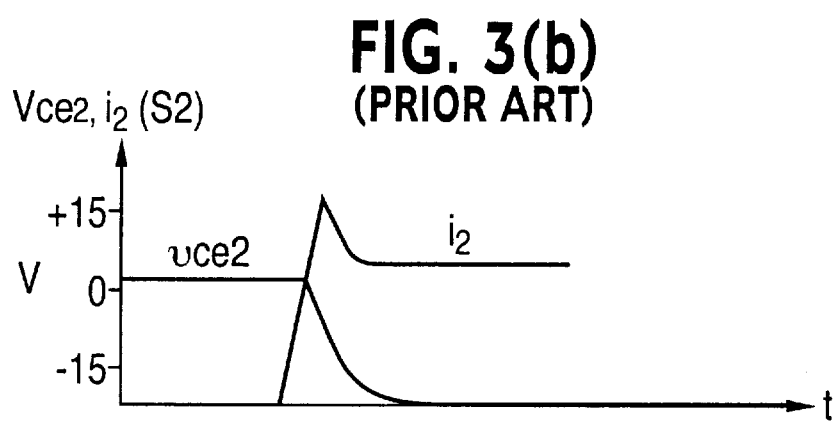
Figure 3C:
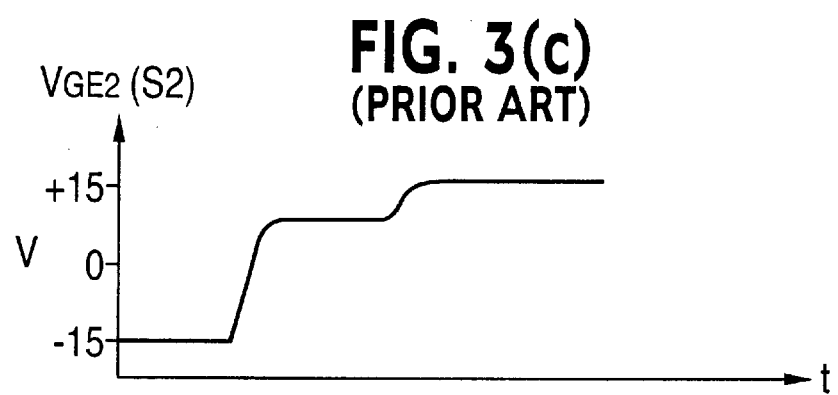
Figure 4:
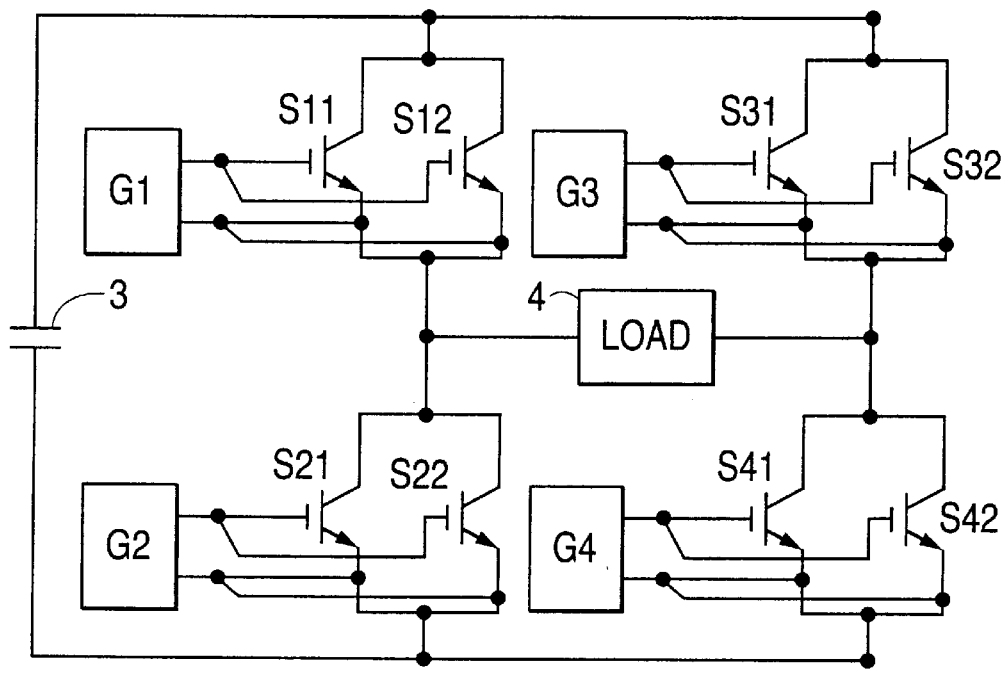
FIG. 4 is a block diagram for a single-phase inverter composed by parallel-connected elements.

In FIG. 6, the different points from FIG. 2 are the addition of switch $SW_{off}2$ that is connected to gate G of MOS gate type semiconductor element S1 via gate resistor $R_b$, and the addition of time delay circuit TD that applies an OFF signal to switch $SW_{off}2$ after a specified time-lag. Gate resistor $R_b$ is smaller than gate resistor $R_g$, it is about 1□, for example.

The following is a description of the operation of the first embodiment.

For actual turn-off, at first, switch $SW_{off}$ closes when an OFF signal is applied, and the gate circuit that uses gate resistor $R_g$ is caused to perform in the same way as in prior art. Also, the OFF signal closes switch $SW_{off}2$ after time T1 that is set by time-delay circuit TD, for example after a time T1 that is a little longer than the completion time of the turn-off operation, for instance after 10 $\mu$s. Thus, a negative bias is applied via gate resistor $R_b$.

Gate resistor $R_b$ has a smaller resistance value than gate resistor $R_b$ and thus the negative bias effect becomes greater. Moreover, resistor $R_g$ may be completely eliminated.

Power source $E_{off}$ is applied directly between the gate and the emitter in this case. Thus, the negative bias effect is greater, and is stable. Therefore, there is no risk of erroneous fire. Also, time T1 may be set to be the same as the so-called 'dead time'.

Also, as a different timing, the negative bias also is overcome when opposite elements of the upper and lower arms turn ON. Therefore by closing in synchronization with the closing of turn-on switches $SW_{on}$ of opposite elements of the upper and lower arms, overcoming of the negative bias can also be inhibited when opposite elements of the upper and lower arms turn on.

Since a negative bias can reliably be applied in this way, the negative bias becoming unstable and erroneous fire due to the effect, for example, of the switching of opposite elements of the upper and lower arms is eliminated.

The following is a description of a second embodiment of the present invention.

Figure 8:
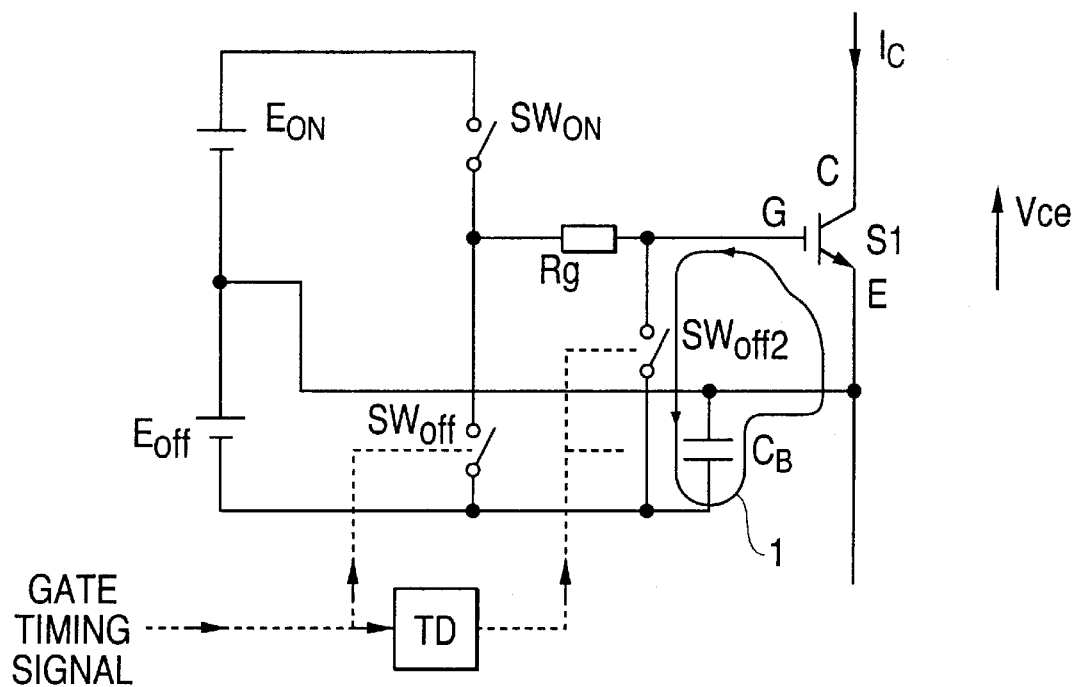
FIG. 8 is a block diagram of a second embodiment of the present invention.

FIG. 8 is a block diagram of a second embodiment of the present invention. Components that are the same as in FIG. 6 have been assigned the same reference symbols, and their descriptions have been omitted.

In FIG. 8, the point of difference from FIG. 6 is the addition of capacitor $C_{BE}$ that is connected between OFF gate power source $E_{off}$ and emitter E of MOS gate type semiconductor element S1.

In the case of such a gate circuit, OFF gate power source $E_{off}$ is very often composed of an electrolytic capacitor with large internal impedance.

In the case of making the negative bias more effective, the effect of the negative bias is further heightened by adding a capacitor $C_B$ with a good frequency characteristic, and also a composition such that loop 1 becomes the minimum wiring.

The following is a description of a third embodiment of the present invention.

Figure 9:
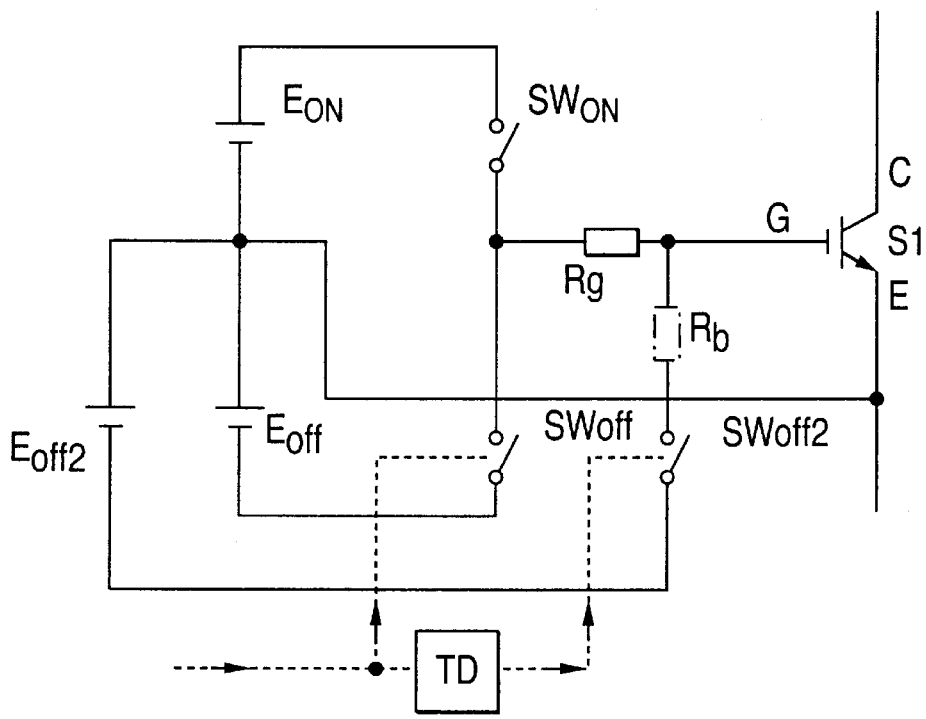
FIG. 9 is a block diagram of a third embodiment of the present invention.

FIG. 9 is a block diagram of a third embodiment of the present invention. Components that are the same as in FIG. 6 have been assigned the same reference symbols, and their descriptions have been omitted.

In FIG. 9, the point of difference from FIG. 6 is that the power source of switch $SW_{off}2$ is made power source $E_{off}2$ that is separate from OFF gate power source $E_{off}$. The voltage of power source $E_{off}2$ is set higher than that of OFF gate power source $E_{off}$.

The higher the negative bias voltage, the more stable, but the gate has a limiting withstand-voltage of, for example, about 40V or 50V. However, there are switch $SW_{on}$ and switch $SW_{off}$ in the gate circuit, and also an electrostatic capacity is present in the gate. Therefore a transient voltage occurs.

Consequently, normally, 15V is selected for ON gate power source $E_{on}$ and OFF gate power source $E_{off}$. However, if the turn-off operation is finished and the charging of the gate capacity is completed, there is no fear of the occurrence of a transient over-voltage. Therefore, a negative bias power source $E_{off}2$ that is larger than OFF gate power source $E_{off}$, for example 25V, can be used.

By this means, the negative bias voltage becomes greater, and thus a stable negative bias can be expected.

The following is a description of a fourth embodiment of the present invention.

Figure 10:
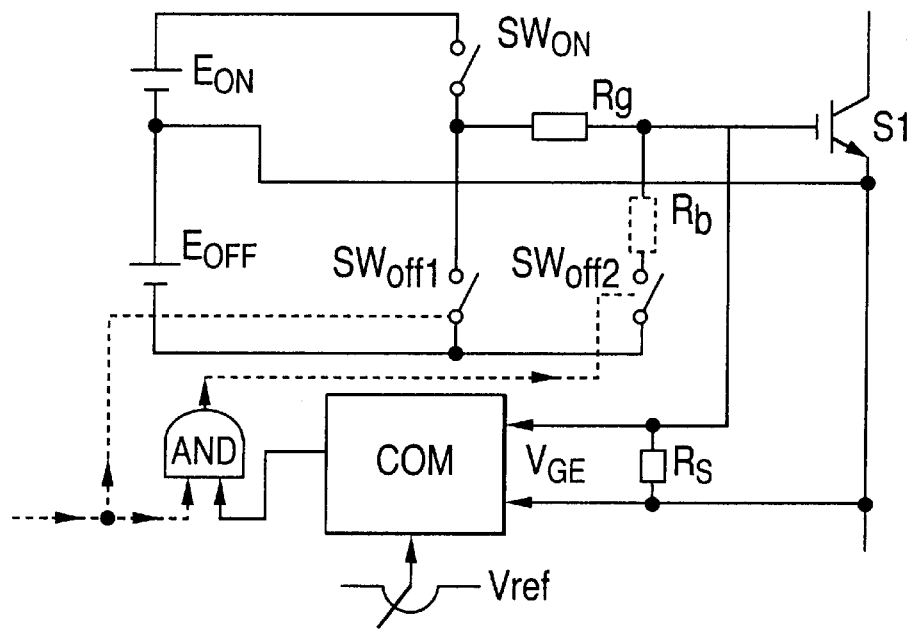
FIG. 10 is a block diagram of a fourth embodiment of the present invention.

FIG. 10 is a block diagram of a fourth embodiment of the present invention. Components that are the same as in FIG. 6 have been assigned the same reference symbols, and their descriptions have been omitted.

In FIG. 10, the point of difference from FIG. 6 is that as opposed to the signal for switch $SW_{off}2$ being provided by time delay circuit TD as in FIG. 6, it is supplied by the gate voltage of MOS gate type semiconductor element S1 becoming a specified value or less.

In practice, gate voltage $V_{GE}$ of MOS gate type semiconductor element S1 and set voltage value $V_{ref}$ are compared by comparator COM. The logical product of the output of comparator COM and the OFF signal are inputted by an AND circuit, and the output of the AND circuit is taken as the signal for switch $SW_{off}$.

Here the operation of this embodiment will be described.

When gate voltage $V_{GE}$ becomes set voltage $V_{ref}$ for example 10V, it closes switch $SW_{off}2$. When gate voltage $V_{GE}$ falls to this sort of voltage, the essential part of the turn-off operation has been completed. Therefore, even if the gate resistor is changed from $R_g$ to $R_b$ or to no resistor, this will not give rise to the problems of turn-off surge voltage and element damage, nor will there be a high dv/dt that generates EMI (Electromagnetic Interference) noise.

In this way, by applying a negative bias via gate resistor $R_b$ with the smaller resistance value at the time when the essential part of the turn-off operation is complete, the negative bias is reliably applied. Therefore, the becoming unstable of the negative bias and erroneous fire due to the effect, for example, of the switching of opposite elements of the upper and lower arms is eliminated.

The following is a description of a fifth embodiment of the present invention.

Figure 11:
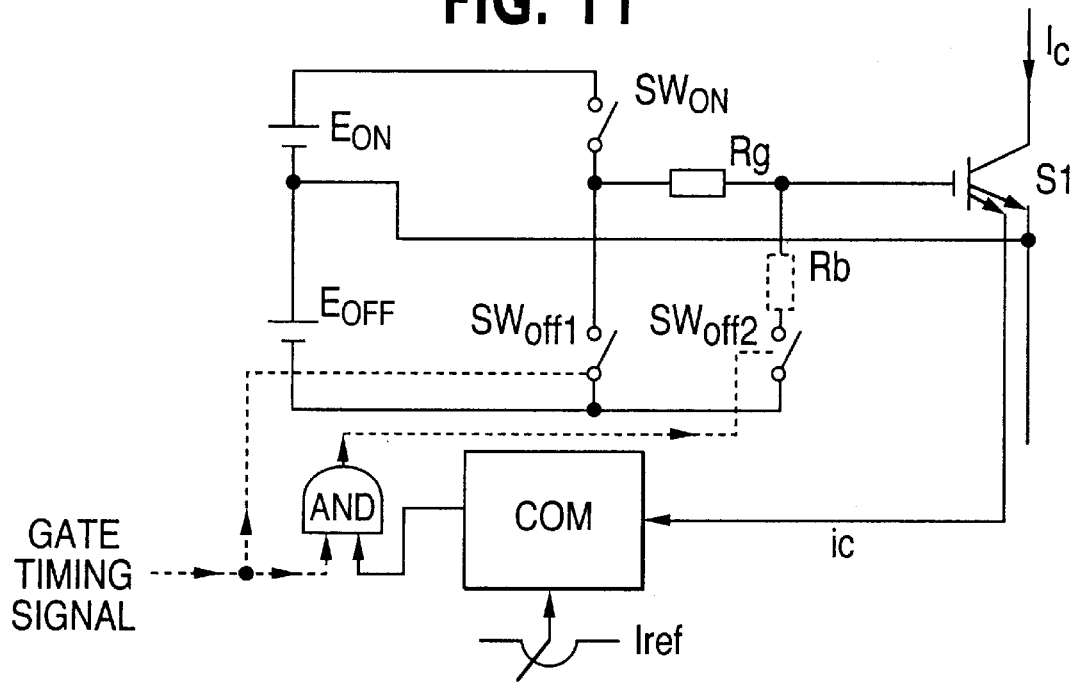
FIG. 11 is a block diagram of a fifth embodiment of the present invention.

FIG. 11 is a block diagram of a fifth embodiment of the present invention. Components that are the same as in FIG. 6 have been assigned the same reference symbols, and their descriptions have been omitted.

In FIG. 11, the different point from FIG. 6 is that the MOS gate type semiconductor element is changed to a current sensor-fitted element, and a signal is applied to switch $SW_{off}2$ by principal current Ic, which is measured by the current sensor, becoming current reference value $I_{ref}$ or less.

In practice, principal current Ic measured by the current sensor and set current value $I_{ref}$ are compared by comparator COM. The logical product of the output of comparator CON and the OFF signal are inputted by an AND circuit, and the output of the AND circuit is taken as the signal for switch $SW_{off}2$.

Here the operation of this embodiment will be described.

When principal current Ic becomes set current value $I_{ref}$, it closes switch $SW_{off}2$. When principal current Ic falls to this sort of current, the essential part of the turn-off operation has been completed. Therefore, even if the gate resistor is changed from $R_g$ to $R_b$ or to no resistor, this will not give rise to the problems of turn-off surge voltage and element damage, nor will there be a high dv/dt that generates EMI noise.

In this way, by applying a negative bias via gate resistor $R_b$ with the smaller resistance value at the time when the essential part of the turn-off operation is complete, the negative bias is reliably applied. Therefore, the becoming unstable of the negative bias and erroneous fire due to the effect, for example, of the switching of opposite elements of the upper and lower arms is eliminated.

The following is a description of a sixth embodiment of the present invention.

Figure 12:
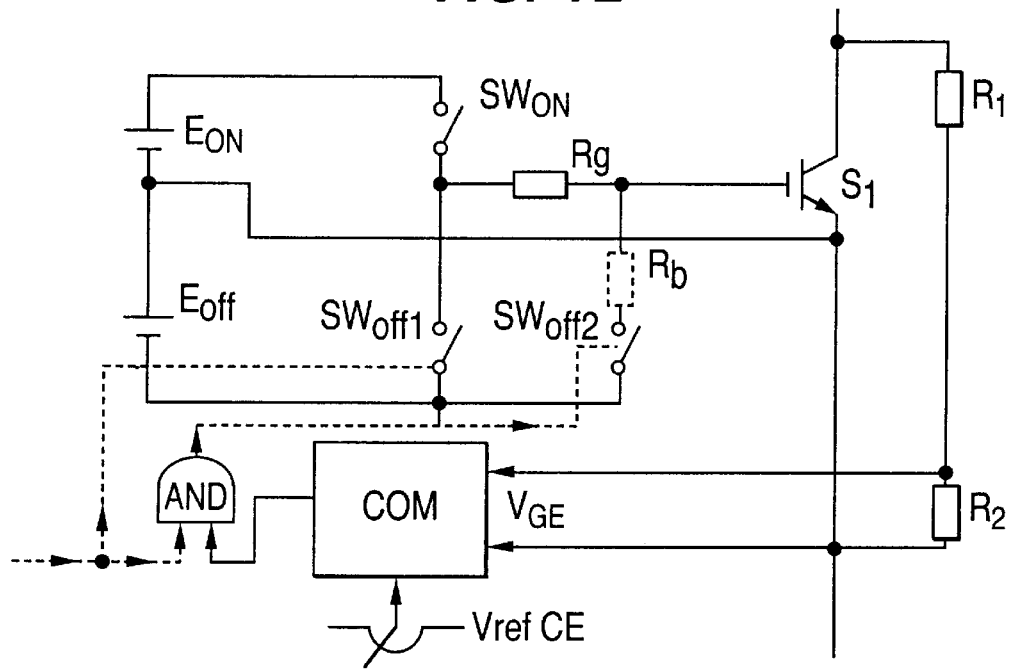
FIG. 12 is a block diagram of a sixth embodiment of the present invention.

FIG. 12 is a block diagram of a sixth embodiment of the present invention. Components that are the same as in FIG. 6 have been assigned the same reference symbols, and their descriptions have been omitted.

In FIG. 12, the different point from FIG. 6 is that the voltage applied to MOS gate type semiconductor element S1 provides a signal to switch $SW_{off}2$ by becoming voltage reference value $V_{ref}CE$ or greater.

In practice, the voltage applied to MOS gate type semiconductor element S1, which is measured by voltage dividing resistors R1 and R2, and set voltage value $V_{ref}CE$ are compared by comparator COM. The logical product of the output of comparator COM and the OFF signal are inputted by an AND circuit, and the output of the AND circuit is taken as the signal for switch $SW_{off}2$.

Here the operation of this embodiment will be described.

The voltage applied to MOS gate type semiconductor element S1 is measured by voltage dividing resistors R1 and R2. When this voltage becomes set voltage value $V_{ref}CE$, it closes switch $SW_{off}2$ When the voltage applied to MOS gate type semiconductor element S1 rises to this sort of voltage, the essential part of the turn-off operation has been completed. Therefore, even if the gate resistor is changed from $R_g$ to $R_b$ or to no resistor, this will not give rise to the problems of turn-off surge voltage and element damage, nor will there be a high dv/dt that generates EMI noise.

In this way, by applying a negative bias via gate resistor $R_6$ with the smaller resistance value at the time when the essential part of the turn-off operation is complete, the negative bias is reliably applied. Therefore, the becoming unstable of the negative bias and erroneous fire due to the effect, for example, of the switching of opposite elements of the upper and lower arms is eliminated.

The following is a description of a seventh embodiment of the present invention.

Figure 13:
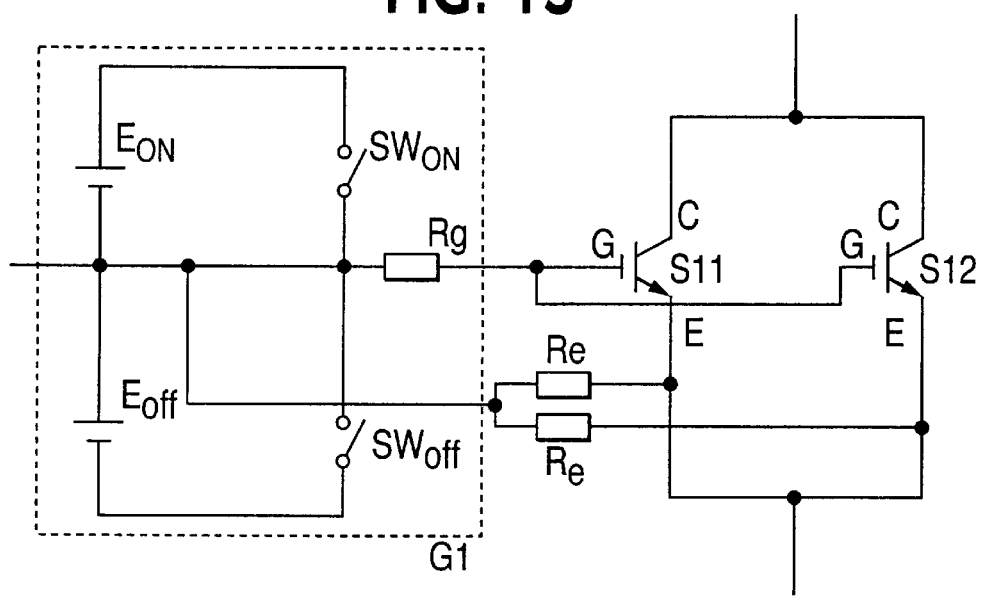
FIG. 13 is a block diagram of a seventh embodiment of the present invention.

FIG. 13 is a block diagram of a seventh embodiment of the present invention. Components that are the same as in FIG. 2 and FIG. 5 have been assigned the same reference symbols, and their descriptions have been omitted.

Figure 5:
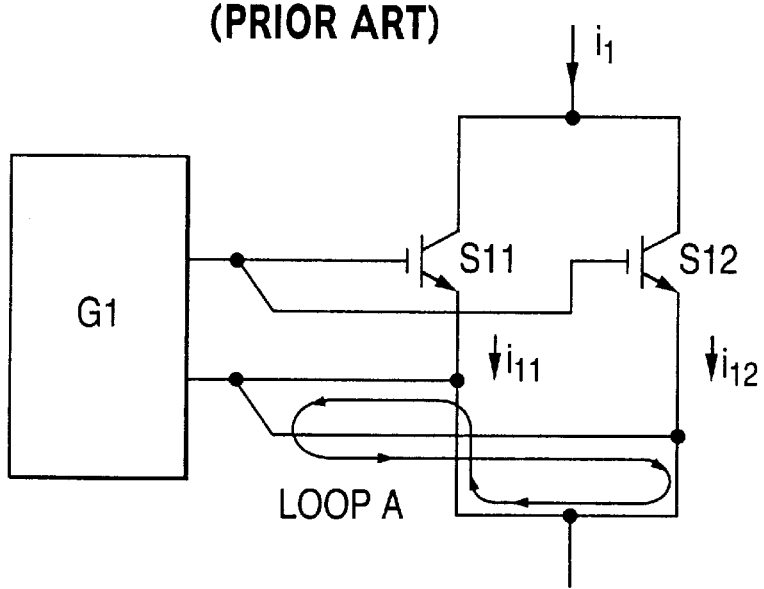
FIG. 5 is an enlarged detail drawing of part of FIG. 4.

In FIG. 13, the point of difference from FIG. 5 is that the design is such that the connection between the node of ON gate power source $E_{on}$ and OFF gate power source $E_{off}$ and emitter E of MOS gate type semiconductor element S11 and emitter E of MOS gate type semiconductor element S12 is executed via resistor $R_e$.

The resistance value of resistor $R_e$ is approximately $\frac{1}{10} \sim \frac{1}{20}$ the value of gate resistor $R_g$, and is of a value level that has no effect on the value of the proper gate resistor $R_g$. For example, when resistor $R_g$ is 10☐, resistor $R_e$ will be about 0.5☐.

In this way, by inserting resistor $R_e$, generation of the circulating current (loop A) shown in FIG. 5 is prevented.

Consequently, since no circulating current arises on the emitter side, the gate potential, and particularly the emitter potential of the gate does not vary. Therefore current balance can be achieved.

The following is a description of an eighth embodiment of the present invention.

Figure 14:
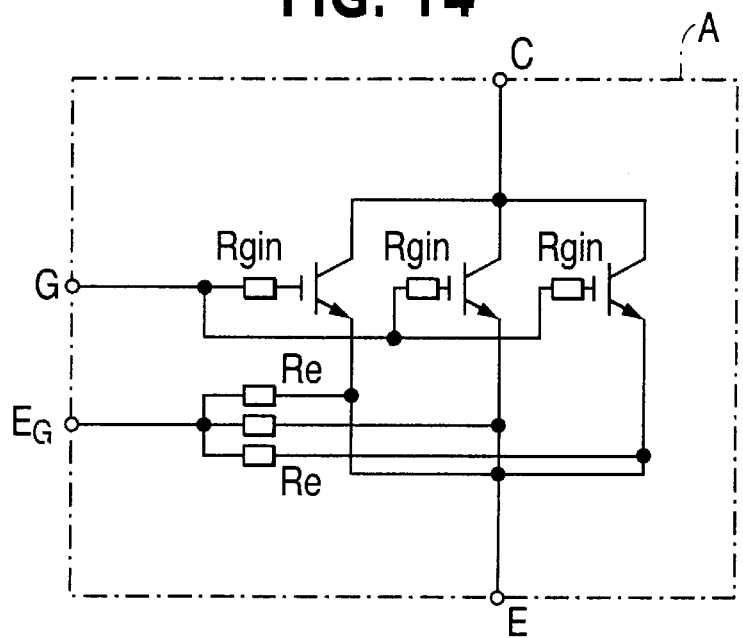
FIG. 14 is a block diagram of an eighth embodiment of the present invention.

FIG. 14 is a block diagram of an eighth embodiment of the present invention. Components that are the same as in FIG. 13 have been assigned the same reference symbols, and their descriptions have been omitted.

FIG. 14 is an example in which parallel-connected MOS gate type semiconductor elements are packaged.

In FIG. 14, the part enclosed by the broken line is the package. This package may be either pressure-welded type or it may be module type. $R_{gin}$ bear no relation to parts of the present invention, and they are small gate resistors originally inserted in the package to obtain a chip current balance.

With this embodiment, resistors $R_e$ are installed in addition to the above. $R_a$ may also be installed by totalling the gate resistance as $(R_{gin}+R_a)$ and co-ordinating it on the emitter aide.

Even though elements S11 and S12 are not chips but are elements inside a package in this way, in the same way no circulating current arises on the emitter side. Therefore, the emitter potential of the gate does not fluctuate, and the current balance between the packaged elements becomes better.

The following is a description of a ninth embodiment of the present invention.

Figure 15:
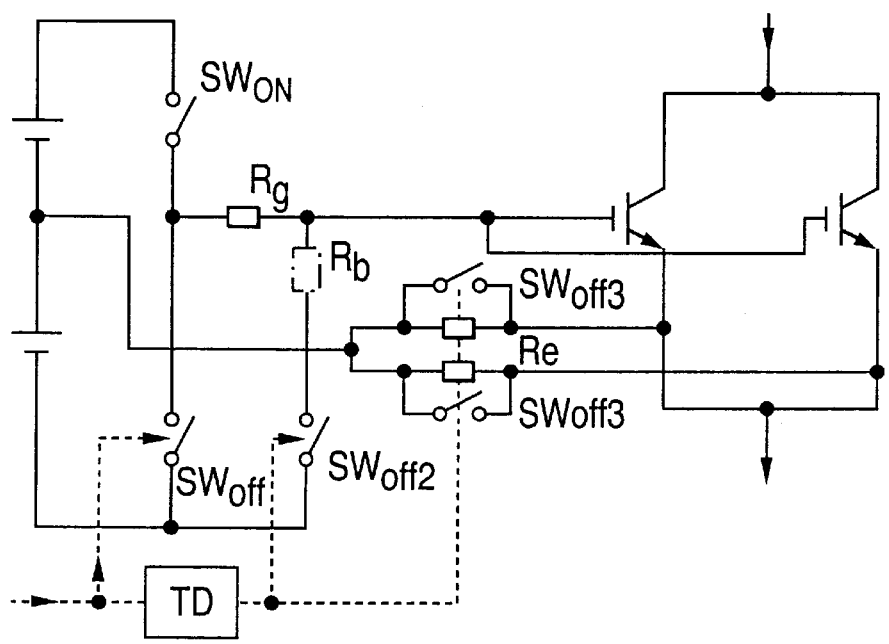
FIG. 15 is a block diagram of a ninth embodiment of the present invention.

FIG. 15 is a block diagram of a ninth embodiment of the present invention. Components that are the same as in FIG. 6 and FIG. 13 have been assigned the same reference symbols, and their descriptions have been omitted.

In FIG. 15, the different points from FIG. 13 are the additions of the following:

switch $SW_{off}2$ that is connected to gates G of the MOS gate type semiconductor elements via gate resistor $R_b$;

switches $SW_{off}3$ that are connected in parallel with resistors $R_e$;

time delay circuit TD that delays the OFF signal by a specified time and supplies it to switch $SW_{off}2$ and switches $SW_{off}3$.

As in the seventh embodiment, when not only gate side resistor $R_g$ but also resistors $R_e$ are installed on the emitter side for the gates, the effect of the negative bias becomes weaker. Therefore, the object of this embodiment is reliably to apply the negative bias by shorting out resistors $R_e$ at times of negative bias.

Here, the opening and closing of switches $SW_{off}3$ is explained. First, if the timing of the closing of switches $SW_{off}3$ is synchronized with the strengthening of the negative bias by shorting out resistor $R_g$ by closing switch $SW_{off}2$ at time T1 after switch $SW_{off}$ has closed, the negative bias will be further strengthened. That is to say, switches $SW_{off}3$ close in synchronization with the closing of switch $SW_{off}2$.

Also, as a different timing, since the negative bias fluctuates when opposite elements of the upper and lower arms turn on, they close in synchronization with the closing of turn-on switches $SW_{on}$ of opposite elements of the upper and lower arms.

In this way, at the same time as the current balance of parallel-connected elements becoming better, the effect can be obtained of the negative bias being reliably applied with no danger of erroneous fire.

The above description has been made with reference to a single-phase two-level inverter. However, the same effect can also be obtained when using the present invention with both three-phase and NPC ( Neutral Point Clamped ) inverters.

As described above, when using the present invention, the negative bias can be stabilized and erroneous fire can be prevented. Also the effect of improving the current balance can be expected when elements are connected in parallel.

Obviously, numerous additional modifications and variations of the present invention are possible in light of the above teachings. It is therefore to be understood that within the scope of the appended claims, the present invention may be practiced otherwise than as specially described herein.

What is claimed is:

1. A gate circuit having a turn-off gate circuit which comprising:

a first OFF gate power source of which one terminal that becomes the power source when a semiconductor switching element turns off is connected to an emitter of the semiconductor switching element;

a first switch that connects the other terminal of said first OFF gate power source and a gate of said semiconductor switching element via a first resistor;

a second OFF gate power source, of which one terminal that has a greater absolute value than said first OFF gate power source is connected to an emitter of said semiconductor switching element; and a second switch for connecting the other terminal of said second OFF gate power source and said gate of said semiconductor switching element, wherein said second switch is connected to said gate of said semiconductor switching element via a second resistor that has a smaller resistance than said first resistor, and said second switch is closed at a specified time interval after said first switch has been closed.

2. A gate circuit according to claim 2, wherein:

said second switch is closed if the gate voltage falls to a specified voltage or below.

3. A gate circuit according to claim 2, wherein:

said second switch is closed if the current flowing in said semiconductor switching element falls to a set current value or below.

4. A gate circuit according to claim 2, wherein:

said second switch is closed if the voltage across the said semiconductor switching element becomes a set voltage value or above.

5. A gate circuit according to claim 2, wherein:

said second switch is closed in synchronization with the turn-on of said semiconductor switching element in an opposite arm.

6. A gate circuit that connects in parallel principal circuit emitter terminals of a plurality of semiconductor switching elements, and is also connected to a negative bias source of said gate circuit by said emitter terminals for plural gates of said plural semiconductor switching elements being connected in parallel, comprising:

resistors respectively for connecting said emitter terminals for said plural gates and said negative bias of said gate circuit; and switches for shorting out said resistors.

7. A gate circuit according to claim 6, wherein:

said switches are closed after completion of turn-off of said semiconductor switching element.

8. A gate circuit according to claim 6, wherein:

said switches are closed in synchronization with the turn-on of said semiconductor switching elements in an opposite arm.

* * * * *